US 8,676,398 B2

(12) United States Patent
Fife et al.

(10) Patent No.: US 8,676,398 B2
(45) Date of Patent: Mar. 18, 2014

(54) TEMPERATURE-CONTROLLED SOLAR POWER INVERTERS (76) Inventors: John M. Fife, Bend, OR (US); Steven G. Hummel, Bend, OR (US); Tod Snider, Bend, OR (US)

(*) Notice: Subject to any disclaimer, the term of this patent is extended or adjusted under 35 U.S.C. 154(b) by 686 days.

(21) Appl. No.: 12/616,779

(22) Filed: Nov. 11, 2009

(65) Prior Publication Data
US 2010/0134959 A1 Jun. 3, 2010

Related U.S. Application Data (60) Provisional application No. 61/113,565, filed on Nov. 11, 2008.

(51) Int. Cl.
*H05K 7/20* (2006.01)
*G05D 23/00* (2006.01)

(52) U.S. Cl.
USPC .......................................... 700/300; 700/299

(58) Field of Classification Search
None
See application file for complete search history.

(56) References Cited

U.S. PATENT DOCUMENTS

| | | | | | |
|---|---|---|---|---|---|
| 6,018,150 | A * | 1/2000 | Maher, Jr. | ...................... | 219/497 |
| 6,191,546 | B1 * | 2/2001 | Bausch et al. | ................ | 318/471 |
| 6,494,381 | B2 * | 12/2002 | Bulthuis | ....................... | 236/49.3 |
| 6,806,415 | B2 * | 10/2004 | Fujisaki et al. | ............... | 136/259 |
| 7,140,768 | B2 * | 11/2006 | Prabhakar | .................... | 374/186 |
| 7,193,872 | B2 | 3/2007 | Siri | | |
| 7,324,361 | B2 | 1/2008 | Siri | | |
| 7,522,418 | B2 * | 4/2009 | Ishimine | ....................... | 361/699 |
| 7,957,169 | B2 * | 6/2011 | Nakajima et al. | ............. | 363/141 |
| 2004/0201359 | A1 * | 10/2004 | Kumar | .......................... | 318/783 |
| 2005/0174737 | A1 * | 8/2005 | Meir | ............................. | 361/697 |
| 2007/0188282 | A1 * | 8/2007 | Folts et al. | ...................... | 336/55 |
| 2007/0279863 | A1 | 12/2007 | Illerhaus | | |
| 2008/0180979 | A1 | 7/2008 | Taylor et al. | | |
| 2009/0046427 | A1 * | 2/2009 | Noteboom et al. | ........... | 361/695 |
| 2009/0271049 | A1 * | 10/2009 | Kinney et al. | ................. | 700/300 |

FOREIGN PATENT DOCUMENTS

| | | |
|---|---|---|
| CN | 101262022 A | 9/2008 |
| JP | 2004-7990 | 3/2004 |
| KR | 1996-0019817 | 6/1996 |
| KR | 10-2006-0030741 | 4/2006 |

OTHER PUBLICATIONS

Echelon Corporation, "i.LON 100 e3 Internet Server", <http://web.archive.org/web/20080128175501/http://www.echelon.com/products/cis/ilon100e3.htm>, published Jan. 28, 2008, 2 pages.
Echelon Corporation, "The NES System Architecture", <http://web.archive.org/web/20071122211010/http://www.echelon.com/metering/architecture.htm>, published Nov. 22, 2007, 2 pages.

(Continued)

*Primary Examiner* — Ryan Jarrett
(74) *Attorney, Agent, or Firm* — Perkins Coie LLP (57) ABSTRACT

A temperature-controlled solar power inverter is described herein. The solar power inverter includes multiple components (for example, a power transistor, a control board, or a heat sink). The temperature of a component may rise due to heat generated by the component or heat absorbed from other components. The solar power inverter also includes a temperature sensor configured to measure a temperature at a location proximate to the component and a cooling device configured to cool the component. The solar power inverter also includes a controller coupled to the temperature sensor and the cooling device. The controller is programmed to receive the temperature from the temperature sensor and control the cooling device based upon the temperature and a temperature setpoint of the component. The temperature setpoint is based upon 1) a component initial temperature, 2) a temperature excursion limit of the component, and 3) an absolute temperature limit of the component.

5 Claims, 6 Drawing Sheets (56) References Cited

OTHER PUBLICATIONS

U.S. Appl. No. 12/616,777, filed Nov. 11, 2009, Hoffman et al.
International Search Report and Written Opinion for International Application No. PCT/US2009/064076, Mail Date Jan. 6, 2010, 11 pages.
Canadian Examiner's Report for Application No. 2742809, Feb. 20, 2013, 3 pages.
Chinese First Office Action for Application No. 200980154182.5, Mail Date Nov. 20, 2012, 11 pages.
Korean Office Action for Application No. 10-2011-7013412, Jul. 30, 2012, 4 pages.

* cited by examiner

TEMPERATURE-CONTROLLED SOLAR POWER INVERTERS

CROSS-REFERENCE TO RELATED APPLICATION(S)

This application claims the benefit of U.S. Provisional Patent Application No. 61/113,565 filed Nov. 11, 2008, entitled "TEMPERATURE CONTROL ALGORITHMS FOR HIGH RELIABILITY SOLAR POWER INVERTERS," which is incorporated herein by reference in its entirety.

TECHNICAL FIELD

This application describes solar power inverters, such as temperature controlled solar power inverters, and associated systems and methods.

BACKGROUND

Solar power inverters may operate in environments that present high temperature exposure as well as wide temperature operating ranges. For a solar power inverter in such an environment, the high temperature exposure and wide temperature operating ranges may increase the risk of failure of various components over the operating lifetime of the solar power inverter. Moreover, certain components within a solar power inverter may generate substantial heat that, if not adequately dispersed, may also increase the risk of failure of various components of the solar power inverter.

DETAILED DESCRIPTION

A. Overview

The present disclosure describes solar power inverters, including temperature-controlled solar power inverters. Certain details are set forth in the following description and in FIGS. 1-6 to provide a thorough understanding of various embodiments of the technology. Other details describing well-known aspects of solar power inverters, however, are not set forth in the following disclosure so as to avoid unnecessarily obscuring the description of the various embodiments.

Many of the details, dimensions, angles and other features shown in the Figures are merely illustrative of particular embodiments. Accordingly, other embodiments can have other details, dimensions, angles and features. In addition, further embodiments can be practiced without several of the details described below.

In the Figures, identical reference numbers identify identical, or at least generally similar, elements. To facilitate the discussion of any particular element, the most significant digit or digits of any reference number refer to the Figure in which that element is first introduced. For example, element 100 is first introduced and discussed with reference to FIG. 1.

In one embodiment, a solar power inverter includes a component whose temperature is to be controlled. The component may be associated with converting direct current power from a solar panel to alternating current power for use at a site or delivery to a general power grid. For example, the component may be an electrical or electronic component (for example, a power transistor or a control board) or a non-electrical and non-electronic component (for example, a heat sink). During operation of the solar power inverter, the temperature of the component may rise due to heat that is generated by the component or that is absorbed from other components. The solar power inverter also includes a temperature sensor configured to measure a temperature at a location proximate to the component and a cooling device configured to cool the component. The solar power inverter also includes a controller coupled to the temperature sensor and the cooling device. The controller is programmed or configured to receive the temperature from the temperature sensor and control the cooling device based upon the temperature and a temperature setpoint of the component. The temperature setpoint may be a previously determined or calculated value that is based upon 1) a component initial temperature (for example, an initial coldest ambient temperature), 2) a temperature excursion limit of the component, and 3) an absolute temperature limit of the component.

In another embodiment, a method of cooling a component of a solar power inverter includes determining a temperature of the component and controlling a cooling device configured to cool the component based upon the temperature and a temperature setpoint of the component. The temperature setpoint is based upon at least one of 1) a component initial temperature (for example, an initial coldest ambient temperature), and 2) a temperature excursion limit of the component. In some cases, the temperature setpoint is further based on 3) an absolute temperature limit of the component.

B. Embodiments of Solar Power Inverters and Associated Methods and Systems

Figure 1:
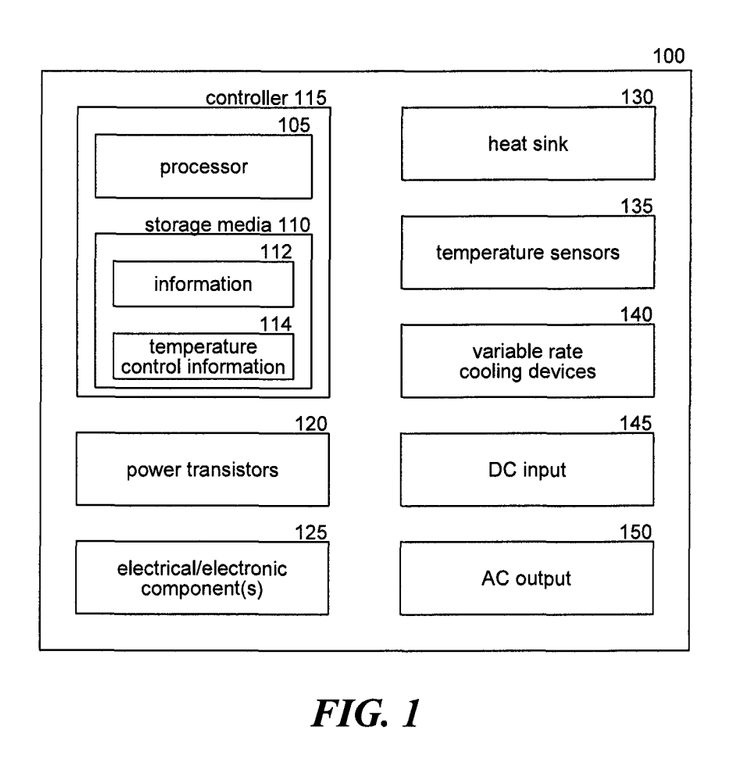
FIG. 1 is a block diagram illustrating components of a solar power inverter configured in accordance with an embodiment of the technology.

FIG. 1 is a block diagram illustrating components of a solar power inverter 100 configured in accordance with a particular embodiment. The components may be positioned or enclosed within a physical cabinet or housing (not illustrated in FIG. 1) of the solar power inverter 100. The solar power inverter 100 and its components may be configured as described in U.S. patent application Ser. No. 12/616,777, entitled, "SOLAR INVERTER CABINET ARCHITECTURE," filed Nov. 11, 2009, which is incorporated herein by reference in its entirety.

The solar power inverter 100 includes a direct current (DC) input component 145 that receives DC produced by photovoltaic arrays to which the solar power inverter 100 is coupled. The solar power inverter 100 includes power transistors 120, such as insulating gate bipolar transistors (IGBTs), which transform DC into alternating current (AC) for output by an AC output component 150 to a utility grid. The solar power inverter 100 further includes various other electrical and/or electronic components 125, such as circuit boards, capacitors, transformers, inductors, electrical connectors, and/or other components that perform and/or enable performance of various functions.

The solar power inverter 100 also includes a heat sink 130, multiple temperature sensors 135, and multiple variable rate cooling devices 140. The heat sink 130 may be positioned proximate to the components of the solar power inverter 100 that generate a significant amount of heat, such as the power transistors 120, in order to dissipate the generated heat. The multiple temperature sensors 135 may include integrated circuit temperature sensors, thermistors, thermocouples, bi-metal thermal switches, thermal transducers or actuators, or any other suitable devices for measuring or sensing temperature. The multiple temperature sensors 135 may be positioned at various locations of the solar power inverter 100. For example, a first temperature sensor 135 may be positioned proximate to an air inlet (not shown) of the solar power inverter 100, one or more second temperature sensors 135 may be positioned proximate to a portion of the heat sink 130, and a third temperature sensor 135 may be positioned proximate to certain components (for example, an inductor). Other temperature sensors 135 may be positioned proximate to other components of the solar power inverter 100.

The multiple variable rate cooling devices 140 may include, for example, multiple fans or blowers that can be run at variable rates (for example, at full speed (100%), at half speed (50%), or at any other speed less than 100%). As another example, the multiple variable rate cooling devices 140 may include water or fluid cooling systems whose rate can be varied (for example, a flow rate of a liquid coolant). Those of skill in the art will understand that the multiple variable rate cooling devices 140 may include various types of devices for cooling or lowering the temperatures of components of the solar power inverter 100.

The solar power inverter 100 further includes a controller 115, which includes a processor 105 and one or more storage media 110. For example, the controller 115 may include a control board having a digital signal processor (DSP) and associated storage media. As another example, the controller 115 may include a computing device (for example, a general purpose computing device) having a central processing unit (CPU) and associated storage media. The storage media 110 can be any available media that can be accessed by the processor 105 and can include both volatile and nonvolatile media, and removable and non-removable media. By way of example, and not limitation, the storage medium 110 may include volatile and nonvolatile, removable and non-removable media implemented via a variety of suitable methods or technologies for storage of information. Storage media include, but are not limited to, RAM, ROM, EEPROM, flash memory or other memory technology, or any other medium (for example, magnetic disks) which can be used to store the desired information and which can accessed by the processor 105.

The storage media 110 stores information 112. The information 112 includes instructions, such as program modules, that are capable of being executed by the processor 105. Generally, program modules include routines, programs, objects, algorithms, components, data structures, and so forth, which perform particular tasks or implement particular abstract data types. The information 112 also includes data, such as values stored in memory registers, which may be accessed or otherwise used by the processor 105. The processor 105 may use the information 112 to perform various functions or cause various functions to be performed. The storage medium also stores temperature control information 114. The processor 105 may use the temperature control information 114 to perform various functions related to controlling the temperature of components of the solar power inverter 100 or cause such functions to be performed.

The solar power inverter 100 may also include components that are not illustrated in FIG. 1. For example, the solar power inverter 100 may include filters for cleaning inlet air. As another example, the solar power inverter 100 may include a communication component (for example, a wired or wireless network interface, a modem, etc.) that enables the solar power inverter 100 to be connected to a computing system (for example, a remote computing system) for various purposes, such as for diagnostic and/or monitoring purposes.

Figure 2:
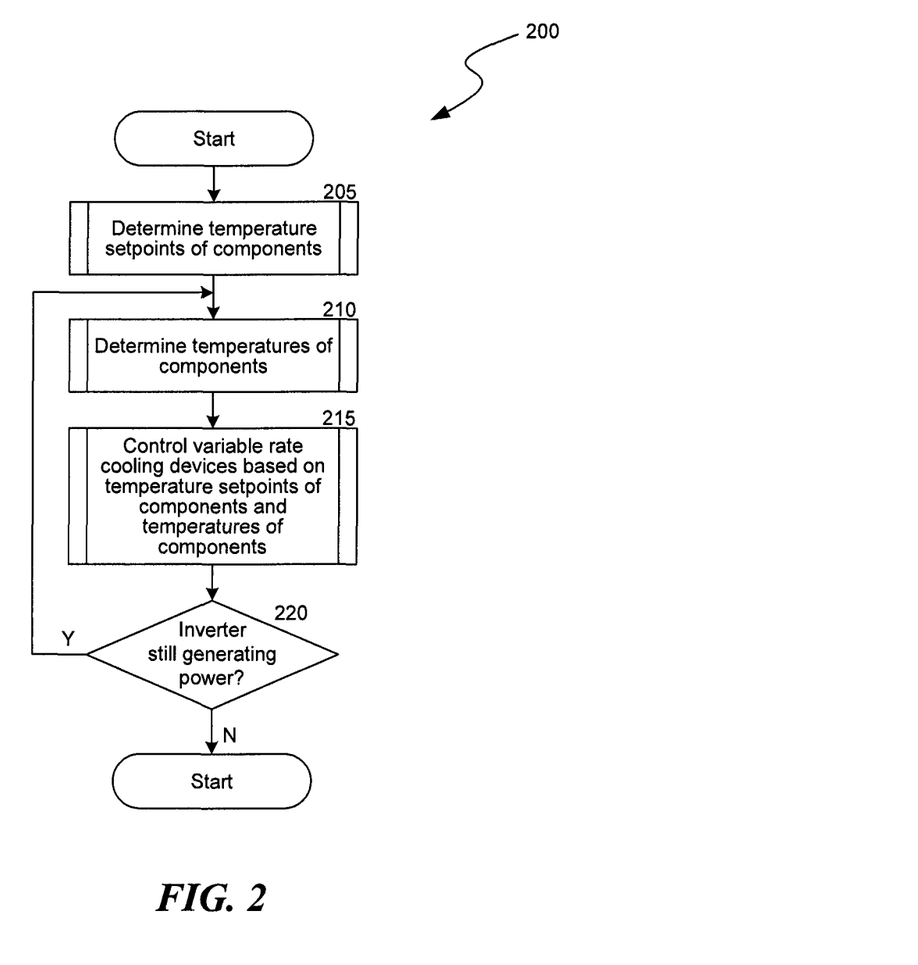
FIG. 2 is a flow diagram of a process for operating a solar power inverter configured in accordance with an embodiment of the technology.

FIG. 2 is a flow diagram of a process 200 for operating the solar power inverter 100. The process 200, as well as the processes 300, 400, and 500 of FIGS. 3, 4, and 5, respectively, are described as being performed by the controller 115 for the sake of brevity. However one or more steps and/or other aspects of one or more of the processes 200, 300, 400, and 500 may be performed by one or more other components of the solar power inverter 100. The process 200 begins at step 205, where the controller 115 determines one or more temperature setpoints of one or more components of the solar power inverter 100, as described further with reference to FIG. 3.

Figure 3:
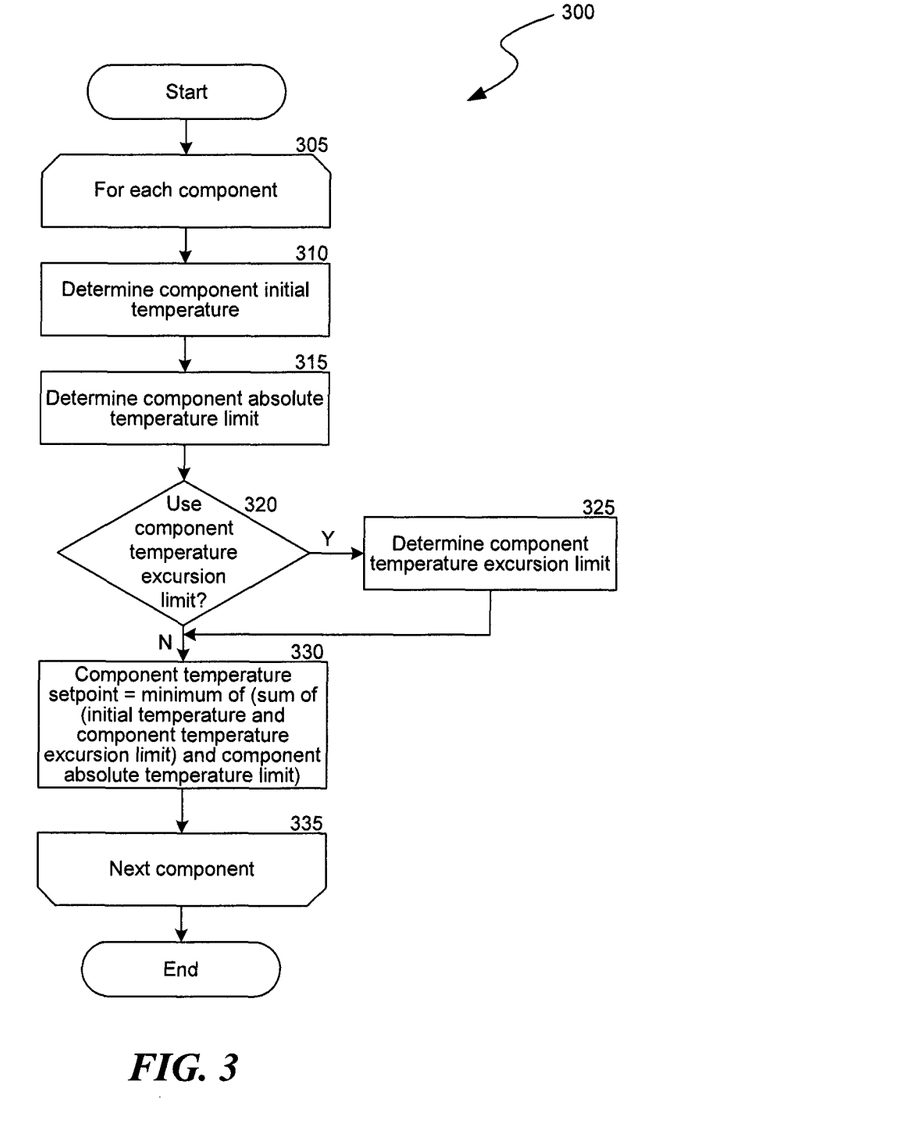
FIG. 3 is a flow diagram of a process for determining temperature setpoints of components of a solar power inverter configured in accordance with an embodiment of the technology.

FIG. 3 is a flow diagram of a process 300 for determining one or more temperature setpoints of one or more components of the solar power inverter 100 in accordance with an embodiment of step 205 of process 200. The process 300 begins at step 305 where the controller 115 selects a component for which a temperature setpoint is to be determined. At step 310 the controller 115 determines a component initial temperature.

The solar power inverter 100 may operate only during the day, and thus some or all of the components of the solar power inverter 100 may not generate or absorb heat when the solar power inverter 100 is not operating. Because such components are not generating or absorbing heat, the components' temperatures decrease. The components' temperatures may decrease such that the components' temperatures are the same as an ambient temperature at a specific point in time. For example, the temperatures of one or more components may decrease such that it is the same as a coldest ambient temperature over a 24-hour period (a generally 24 hour period, such as from sunrise time of one day to sunrise time of the subsequent day). As another example, the temperatures of one or more components may decrease but still be higher than the coldest ambient temperature experienced during the 24-hour period. The controller 115 may receive measurements from a temperature sensor 135 proximate to the component periodically or at various times while the solar power inverter 100 is not generating power. The controller 115 may then use the minimum measured temperature reported by the temperature sensor 135 proximate to the component as the component initial temperature. As described in more detail herein, the use of the minimum measured temperature as the component initial temperature enables the controller 115 to control the component temperature so as to minimize the daily excursion experienced by the component. This in turn reduces the risk of component cyclic thermal fatigue due to repeated differential expansion and contraction of dissimilar materials with changing temperatures.

In some embodiments, the controller 115 may use a minimum measured temperature reported by a temperature sensor 135 at another location within or outside the cabinet of the solar power inverter 100 as the component initial temperature. In some embodiments, the controller 115 may use a fixed constant, or a combination of the minimum measured temperature and the fixed constant as the component initial temperature. In some embodiments, the controller 115 receives a measurement from another source, such as a computing system, a weather station, or another solar power inverter and use the received measurement as the component initial temperature.

At step 315 the controller 115 determines an absolute temperature limit of the component. The absolute temperature limit of the component is a constant that the temperature of the component generally should not meet or exceed while the solar power inverter 100 is operating. The absolute temperature limit may have been provided by a manufacturer or supplier of the component and/or determined by reliability modeling. If the component temperature meets or exceeds the absolute temperature limit, it may increase the risk of chemical breakdown, diffusion, and/or otherwise early wear out of the component.

For example, the controller 115 may determine that the temperature of the heat sink 130 generally should be less than a constant while the solar power inverter 100 is operating, as indicated by equation (1):

$$T_{HS} < C_{HS\ Abs\ Temp\ Limit} \tag{1}$$

In some embodiments, the absolute temperature limit is a variable that is dependent upon various factors, such as power being generated by the solar power inverter 100, voltage of the solar power inverter 100, and/or current of the solar power inverter 100.

At step 320, the controller 115 determines whether a temperature excursion limit of the component is to be used. If not, the process 300 continues to step 330. If so, the process 300 continues to step 325, where the controller 115 determines the temperature excursion limit of the component. Temperature excursion of a component is the change in temperature (for example, the rise in temperature) of the component from the component initial temperature, and the temperature excursion limit is a constant. The temperature of the component generally should not meet or exceed the sum of the temperature excursion limit and the component initial temperature. The temperature excursion limit may have been provided by a manufacturer or supplier of the component and/or determined by reliability modeling. If the temperature of the component meets or exceeds the sum of the temperature excursion limit and the component initial temperature, it may increase the risk of cyclic thermal fatigue due to repeated differential expansion and contraction of dissimilar materials with changing temperatures.

For example, the temperature of the heat sink 130 generally should not exceed a sum of the temperature excursion limit and the component initial temperature, as indicated by equation (2):

$$T_{HS} < T_{HS\ Initial\ Temp} + C_{HS\ Temp\ Excursion\ Limit} \tag{2}$$

In some embodiments, the temperature excursion limit is a variable that is dependent upon various factors, such as power being generated by the solar power inverter 100, voltage of the solar power inverter 100, and/or current of the solar power inverter 100.

After step 325 the process 300 continues to step 330, where the controller 115 determines the temperature setpoint of the component. The component temperature setpoint is the minimum of the value of the component absolute temperature limit and the sum of the component temperature excursion limit and the component initial temperature. For example, the controller 115 may determine that the temperature setpoint of the heat sink 130 is the minimum of the value of the heat sink absolute temperature limit and the value of the sum of the component initial temperature and the heat sink temperature excursion limit, as indicated by equation (3):

$$T_{HS\ Setpoint} = \min(C_{HS\ Abs\ Temp\ Limit}, (T_{HS\ Initial\ Temp} + C_{HS\ Temp\ Excursion\ Limit})) \tag{3}$$

For a component for which the controller 115 does not use the component temperature excursion limit, the component temperature setpoint is equal to the component absolute temperature limit.

After determining the temperature setpoint of the component, the process 300 continues to step 335, where the controller 115 selects a next component for which to determine a temperature setpoint, and performs steps 315-330 for the next component. For example, the controller 115 may determine temperature setpoints for the controller 115, for a frame structure proximate to an inductor, and/or for other components of the solar power inverter 100. Additionally or alternatively, the controller 115 may determine temperature setpoints at specific locations within the cabinet of the solar power inverter 100 or outside the cabinet of the solar power inverter 100. If there are no more components, the process 300 concludes.

Returning to FIG. 2, after step 205, the process 205 continues at step 210, where the controller 115 determines temperatures of components. As previously described, a temperature sensor 135 may be positioned directly proximate to a component of the solar power inverter 100, and temperature measurements by the temperature sensor 135 may be used as measurements of the component temperature. Additionally or alternatively, the controller 115 may have to determine a temperature of another component, for which there is no temperature sensor directly proximate. For example, a first component (for example, the heat sink 130) may be proximate to a second component (for example, the power transistors 120), with material positioned between the two components. The controller 115 may estimate the temperature of the second component based upon a measured temperature of the first component, as described further with reference to FIG. 4.

Figure 4:
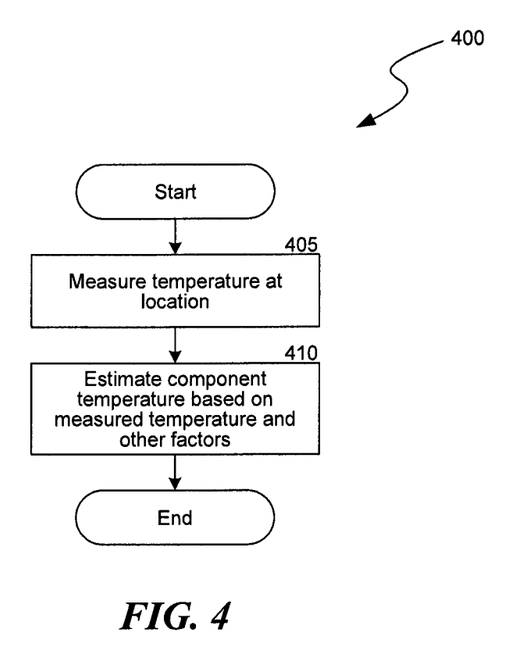
FIG. 4 is a flow diagram of a process for determining a temperature of a component of a solar power inverter configured in accordance with an embodiment of the technology.

FIG. 4 is a flow diagram of a process 400 for determining a temperature of a component of the solar power inverter 100 in accordance with an embodiment of step 210 of process 200. The process 400 begins at step 405, where the temperature is measured by a temperature sensor 135 at a location (for example, directly proximate to a first component, such as the heat sink 130). At step 410 the controller 115 receives the temperature measurement and estimates a temperature of a component, based upon the temperature measurement and other factors, such as a rate of heat transfer between two components and a thermal resistance of a medium between the two components. For example, using the measured temperature of the heat sink 130, the temperature of the power transistors 120 may be estimated, using equation (4):

$$T_{PT} = T_{HS} + \text{Heat Transfer Rate} \times \text{Thermal Resistance} \tag{4}$$

In equation (4), $T_{PT}$ is the temperature of the power transistors 120, $T_{HS}$ is the temperature of the heat sink 130, Heat Transfer Rate is the rate at which heat is transferred from the power transistors 120 to the heat sink 130, and Thermal Resistance is the thermal resistance of the material between the power transistors 120 and the heat sink 130. After step 410 the process 400 concludes.

Figure 5:
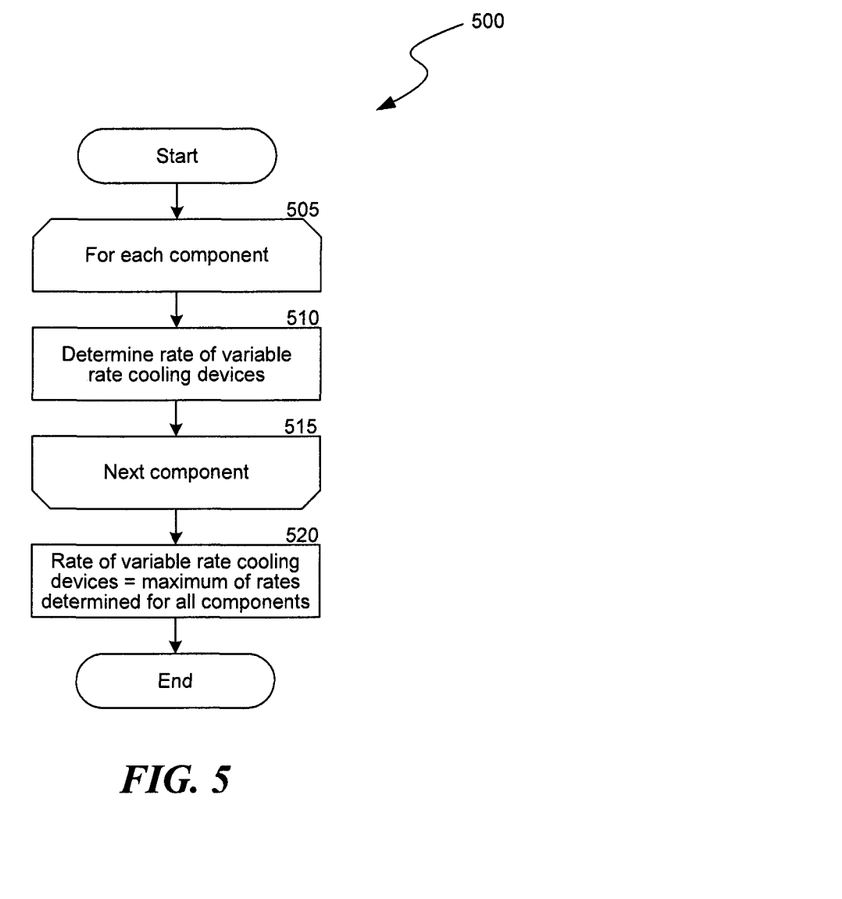
FIG. 5 is a flow diagram of a process for determining a rate of a variable rate cooling device of a solar power inverter configured in accordance with an embodiment of the technology.

Returning to FIG. 2, the process 200 continues to step 215, where the controller 115 controls the variable rate cooling devices 140, based upon component temperature setpoints and component temperatures, as described further with reference to FIG. 5.

FIG. 5 is a flow diagram of a process 500 for determining rates of the variable rate cooling devices 140 in accordance with an embodiment of step 215 of process 200. The process 500 begins at step 505, where the controller 115 selects a component for which a rate is to be determined. At step 510 the controller 115 determines a rate for the variable rate cooling devices 140, based upon the component temperature setpoint and the component temperature (measured or estimated). For example, if the variable rate cooling devices 140 include fans or blowers, the determined rate is the speed of the fans or blowers, expressed as a percentage of the maximum speed of the fans or blowers (for example, 20%). The controller 115 may determine the rate using a proportional control, a proportional-integral (PI) control, a proportional-integral-derivative (PID) control, or using other techniques.

The controller 115 may delay initiating operating or activating the variable rate cooling devices 140 until a component temperature is within a specific range of the component temperature setpoint. For example, if the temperature setpoint of the heat sink 130 is x degrees Celsius, the controller 115 may delay initiating operating the variable rate cooling devices 140 until the heat sink temperature reaches x-m degrees Celsius. Once the heat sink temperature reaches x-m degrees Celsius, the controller 115 may operate the variable rate cooling devices 140 at a minimum rate (for example, 15%). As the heat sink temperature rises, the controller 115 continues to operate the variable rate cooling devices 140 at the minimum rate throughout a specific dead band, until the heat sink temperature reaches x-n degrees Celsius. As the heat sink temperature exceeds x-n degrees Celsius, the controller 115 may increase the rate of the variable rate cooling devices 140.

One advantage of delaying initiating operating the variable rate cooling devices 140 is that it reduces and/or minimizes the amount of power needed to operate the variable rate cooling devices 140 and associated components. This assists in maximizing the overall efficiency of the solar power inverter 100 because the solar power inverter 100 can provide more power to a utility grid and/or minimize the power drawn from the utility grid.

In embodiments where the variable rate cooling devices 140 include fans or blowers, there is an additional advantage to delaying initiating operating the fans or blowers. In certain environments the ambient air may be moist. If the moist air is moved by the fans or blowers over components of the solar power inverter 100 that have a slightly lower temperature than the moist air, condensation may occur on certain components, such as sensitive electronics, and potentially damage such components. This scenario has the potential to occur at certain times, such as just after sunrise, when the ambient air may be most humid. In some embodiments, the controller 115 delays initiating operating the fans or blowers until one or more temperatures of one or more components exceeds the ambient temperature. The components' temperatures may have to merely exceed the ambient temperature or exceed the ambient temperature by a threshold (pre-defined or otherwise) amount. Delaying initiating operating the fans or blowers allows component temperatures to increase prior to experiencing airflow, so that if and when moist air is passed over the solar power inverter components, the heat of those components inhibits the formation of condensation on surfaces of those components, which may be sensitive electronic surfaces.

At step 515 the controller 115 selects a next component for which a rate of the variable rate cooling devices 140 is to be determined, and performs step 510 for the next component. If there are no more components, the process 500 continues at step 520. The controller 115 determines a rate of the variable rate cooling devices 140 by determining the maximum of the all the rates determined for all components, using equation (5):

$$\text{Rate} = \max(\text{Rate}_{C1}, \text{Rate}_{C2}, \ldots, \text{Rate}_{Cn}) \quad (5)$$

For example, if the controller 115 determines that a first rate of the variable rate cooling devices 140 for a first component is 15%, a second rate of the variable rate cooling devices 140 for a second component is 25%, and a third rate of the variable rate cooling devices 140 for a third component is 20%, the controller 115 will set the rate of the variable rate cooling devices 140 to be the maximum of these three rates, which is 25%. The controller 115 may use the maximum for the rate of the variable rate cooling devices 140 because the variable rate cooling devices 140 commonly cool multiple components via a mechanism that enables cooling the multiple components. For example, if the variable rate cooling devices 140 include fans or blowers, each of the fans or blowers provides air to the same set of components, such as by using a common plenum that accesses the same set of components. Put another way, the solar power inverter 100 uses a single cooling source (the multiple variable rate cooling devices 140 that cool using a common mechanism) to control the temperature of multiple components of the solar power inverter 100.

The variable rate cooling devices 140 also provide redundancy, in that even if a first variable rate cooling device 140 fails, there is at least a second variable rate cooling device 140 that can cool components of the solar power inverter 100, even if the solar power inverter is operating at full power at high temperatures. For example, the controller 115 may monitor the first and second variable rate cooling devices, determine if either the first or second variable rate cooling devices fails, and control the variable rate cooling device that did not fail (for example, by increasing the rate of the variable rate cooling device that did not fail). Moreover, each variable rate cooling device 140 can be run under normal conditions at a derated value (e.g., lower rate). For example, if the variable rate cooling devices 140 include fans or blowers, the fans or blowers may be run at half speed and still be able to cool components of the solar power inverter 100, even when the solar power inverter 100 is operating at full power at high temperatures. This ability to operate the variable rate cooling devices 140 at a derated value decreases the risk that one or more of the variable rate cooling devices 140 will fail during the operating life of the solar power inverter 100.

In contrast, conventional cooling techniques of conventional solar power inverters typically use multiple fans, with each fan cooling a proper subset of the components of the conventional solar power inverter that necessitate cooling. Accordingly, conventional solar power inverters cannot control the temperature of all the components that necessitate cooling using a single cooling device. Moreover, the use of multiple fans adds additional failure modes. Moreover, because conventional solar power inverter fans are typically positioned at multiple locations within the conventional solar power inverter, they do not provide redundancy, in that if one fan fails, the components that the failed fan cools typically cannot be cooled by other fans. Moreover, conventional solar power inverters typically control each fan rate independently of other fan rates. Accordingly, conventional solar power inverters typically do not jointly control multiple fan rates of multiple fans.

Returning to FIG. 2, the process 200 continues at step 220, where the controller 115 determines whether the solar power inverter 100 is still generating power. If so, the process 200 returns to step 210. If not, the process 200 concludes. The solar power inverter 100 may only generate power when the sun is up, and thus there may be no need to cool various components of the solar power inverter 100 after sunset and before sunrise. In some embodiments, the solar power inverter 100 continues to cool various components even after the solar power inverter 100 is no longer generating power.

Those skilled in the art will appreciate that the steps shown in any of FIGS. 2-5 may be altered in a variety of ways. For example, the order of the steps may be rearranged; substeps may be performed in parallel; shown steps may be omitted, or other steps may be included; etc. For example, in some embodiments, instead of determining a component initial temperature for each component (step 305 of process 300), the controller 115 uses the same minimum temperature for each component (for example, a minimum temperature reported by one or more temperature sensors 135). As another example, in some embodiments, the solar power inverter 100 may reduce power generation when the variable rate cooling devices 140 are operating at full speed and a component temperature exceeds a certain threshold. As another example, the solar power inverter 100 may stop power generation when a component temperature exceeds a certain threshold.

Figure 6:
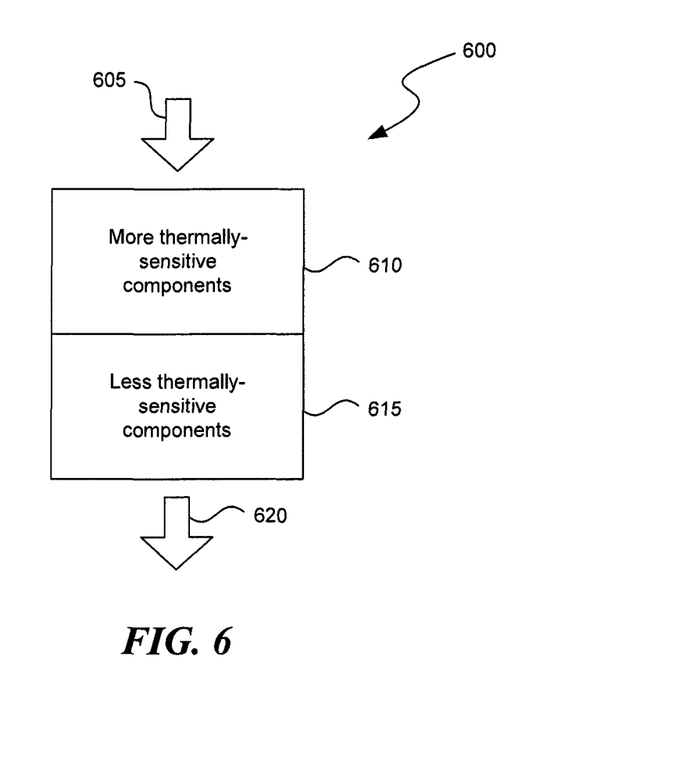
FIG. 6 is a block diagram illustrating coolant flow past components of a solar power inverter configured in accordance with an embodiment of the technology.

FIG. 6 is a block diagram illustrating the flow of coolant (for example, air, fluid, etc.) past components of the solar power inverter 100. Coolant that has greater capacity to cool components of the solar power inverter 100 (for example, because it is the coolest, such as the coolest air), as indicated by arrow 605, is directed first at more-thermally sensitive components 610. As the coolant warms, it can be directed at less-thermally sensitive components 615 and then dispersed or recycled as indicated by arrow 620. For example, if the variable rate cooling devices 140 include fans or blowers, the airflow produced by the fans or blowers, can flow first over or past more thermally-sensitive components such as the power transistors 120. Having absorbed heat from the more thermally-sensitive components, the airflow can then flow over or past less thermally-sensitive components such as inductors or transformers, and then exit the solar power inverter 100. More details as to how solar power inverters 100 may be configured to enable such cooling are described in the previously-mentioned U.S. patent application Ser. No. 12/616,777, entitled, "SOLAR INVERTER CABINET ARCHITECTURE," filed Nov. 11, 2009.

From the foregoing, it will be appreciated that specific embodiments of the invention have been described herein for purposes of illustration, but that various modifications may be made without deviating from the spirit and scope of the invention. For example, the elements of one embodiment can be combined with other embodiments in addition to or in lieu of the elements of other embodiments. Accordingly, the invention is not limited except as by the appended claims.

We claim:

1. A solar power inverter, comprising:
a component;
a temperature sensor configured to measure a temperature at a location proximate to the component;
a cooling device configured to cool the component; and
a controller coupled to the temperature sensor and the cooling device, wherein the controller is programmed to:
receive the temperature from the temperature sensor;
determine a temperature of the component from the temperature of the temperature sensor;
determine a temperature setpoint of the component, wherein the temperature setpoint is based upon 1) a component initial temperature, 2) a temperature excursion limit of the component, and 3) an absolute temperature limit of the component;
receive an ambient temperature;
compare the temperature of the component to the ambient temperature; and
delay the activation of the cooling device until the temperature of the component exceeds the ambient temperature by a threshold amount, then activate the cooling device; and
wherein the controller is further programmed to control the cooling device based on the temperature of the component and the temperature setpoint.

2. The solar power inverter of claim 1 wherein the component initial temperature is a minimum temperature of the component during a specified period of time.

3. The solar power inverter of claim 1 wherein the component initial temperature is a minimum temperature of the component during a generally 24-hour period.

4. The solar power inverter of claim 1 wherein the cooling device includes a variable rate cooling device, and wherein the controller is further programmed to vary the rate of the variable rate cooling device based upon the temperature of the component and the temperature setpoint of the component.

5. A solar power inverter, comprising:
a component;
a temperature sensor configured to measure a temperature at a location proximate to the component;
a cooling device configured to cool the component; and
a controller coupled to the temperature sensor and the cooling device, wherein the controller is programmed to:
receive the temperature from the temperature sensor;
control the cooling device based upon the temperature and a temperature setpoint of the component, wherein the temperature setpoint is based upon 1) a component initial temperature, 2) a temperature excursion limit of the component, and 3) an absolute temperature limit of the component:
wherein the cooling device includes at least a first cooling device and a second cooling device configured to cool the component, and wherein the controller is further coupled to the second cooling device and is further programmed to control the first and second cooling devices at a derated value such that either of the first and second cooling device can cool the component in the event that one of the first and second cooling devices fail.

* * * * *